US00RE45831E

(19) United States
(12) Reissued Patent
Tang et al.

(10) Patent Number: US RE45,831 E
(45) Date of Reissued Patent: Dec. 29, 2015

(54) REAR BOARD OF BLADE SERVER, BLADE SERVER AND SUBRACK

(71) Applicant: Huawei Technologies Co., LTD, Shenzhen (CN)

(72) Inventors: Yinzhong Tang, Shenzhen (CN); Zhenyu Zhuang, Shenzhen (CN); Jie He, Chengdu (CN); Jianjun Zhou, Shenzhen (CN)

(73) Assignee: HUAWEI TECHNOLOGIES CO., LTD, Shenzhen (CN)

(21) Appl. No.: 13/963,951

(22) Filed: Aug. 9, 2013

Related U.S. Patent Documents

Reissue of:
(64) Patent No.: 7,995,336
Issued: Aug. 9, 2011
Appl. No.: 12/503,127
Filed: Jul. 15, 2009

U.S. Applications:
(63) Continuation of application No. PCT/CN2008/072501, filed on Sep. 24, 2008.

(30) Foreign Application Priority Data

Nov. 5, 2007 (CN) ..... 2007 2 0195101 U

(51) Int. Cl.
*H05K 5/00* (2006.01)
*H05K 7/00* (2006.01)
(Continued)

(52) U.S. Cl.
CPC ..... *H05K 1/119* (2013.01)

(58) Field of Classification Search
USPC ..... 361/679.31–679.4, 679.55, 679.58, 361/724–727; 439/325–329, 374–377, 439/541.5, 591, 607.34–607.42, 629–638; 369/75.11, 75.21, 76, 77.11, 77.21, 78, 369/79, 80, 81, 82; 312/223.1, 223.2; 29/469
See application file for complete search history.

(56) References Cited

U.S. PATENT DOCUMENTS 6,392,884 B1 * 5/2002 Chou ..... 361/679.33
7,193,847 B2 3/2007 Liang et al.
(Continued)

FOREIGN PATENT DOCUMENTS

CN 1912797 A 2/2007
CN 201118641 Y 9/2008

OTHER PUBLICATIONS

Astute Networks, "Astute Networks Unveils Industry's First 10Gb iSCSI ATCA Storage Blade," New Release, XP002576063, Oct. 16, 2007, 2 pages.
(Continued)

*Primary Examiner* — Jerry Wu
(74) *Attorney, Agent, or Firm* — Huawei Technologies Co., Ltd

(57) ABSTRACT

A rear board of a blade server, a blade server and a subrack are provided. The blade server includes a front board and a back board, the rear board includes a standard ATCA interface, and the rear board is connected to the front board by the standard ATCA interface. The blade server also includes a connector configured to connect hard disks which is set on the rear board, and a portion of the rear board on which the connector is set is extended outward so as to accommodate at least two hard disks, and the at least two hard disks are connected to the connector. The blade server increases the ability of the heat dissipation ability of the front board, and the rear board supports data backup between the two hard disks and hot plug.

21 Claims, 4 Drawing Sheets

(51) Int. Cl.

| | |
|---|---|
| ***G11B 33/02*** | (2006.01) |
| ***G11B 27/00*** | (2006.01) |
| ***H01R 13/62*** | (2006.01) |
| ***H01R 13/625*** | (2006.01) |
| ***H05K 1/11*** | (2006.01) |
| *H01R 25/00* | (2006.01) |
| *B23P 21/00* | (2006.01) |

(56) References Cited

U.S. PATENT DOCUMENTS

| | | | | |
|---|---|---|---|---|
| 2003/0081378 | A1 | 5/2003 | Debbins et al. | |
| 2006/0002080 | A1 | 1/2006 | Leija et al. | |
| 2006/0021774 | A1 | 2/2006 | Tsai et al. | |
| 2006/0221559 | A1* | 10/2006 | Campini et al. | 361/679 |
| 2007/0008695 | A1 | 1/2007 | Chou | |
| 2008/0147930 | A1* | 6/2008 | Su | 710/74 |

OTHER PUBLICATIONS

Astute Networks, "Edge Storage Made Simple," XP055011975, retrieved from the Internet: URL:http://www.astutenetworks.com/pdf/Collateral_Library.pdf, Sep. 9, 2008, 8 pages.

Extended European Search Report received 08800974.1-2212 mailed Apr. 14, 2010, 8 pages.

Extended European Search Report received in Application No. 11179609.0-2212 mailed Dec. 6, 2011, 9 pages.

International Search Report and Written Opinion received in Application No. PCT/CN2008/072501 mailed Jan. 8, 2009, 12 pages.

Oral Proceeding received in Application No. 08800974.1-2212 mailed Mar. 22, 2011, 3 pages.

Oral Proceeding received in Application No. 11179609.0-2212 mailed Jan. 16, 2013, 4 pages.

PICMG, "ATCA PICMG 3.0 Short Form Specification," ATCA PICMG 3.0, XP002576062, Jan. 31, 2003, 34 pages.

Schmid, Patrick "Seagate Savvio 10k.2: 10, 000 RPM," XP55048334, retrieved from the internet: URL:http://www.tomshardware.com/reviews/sas-hard-drives,1702-3.html, Oct. 10, 2007, 2 pages.

United States Office Action received in U.S. Appl. No. 12/503,127 mailed Jan. 10, 2011, 16 pages.

United States Office Action received in U.S. Appl. No. 12/503,127 mailed Jul. 30, 2010, 29 pages.

Wikipedia: "Hard disk drive," XP055011985, retrieved from the internet: URL:http://en.wikipedia.org/wiki/Hard_disk_drive, Nov. 13, 2011, 28 pages.

International Search Report from P.R. China in International Application No. PCT/CN2008/072501 mailed Jan. 8, 2009.

"PICMG 3.0 Short Form Specification," PICMG 3.0 Advanced Telecommunications Comuting Architecture (ATCA), XP-002576062, Jan. 2003, 34 pages, PCI Industrial Computers Manufacturing Group (PICMG).

Written Opinion of the International Searching Authority, International Application No. PCT/CN2008/072501, Date of mailing: Jan. 8, 2009, 5 pages.

Supplementary European Search Report, European Application No. 08800974.1-2212, International Application No. PCT/CN2008/072501, Date of mailing: Apr. 4, 2010, 8 pages.

European Office Action, European Application No. 08 800 974.1-2212, Date of mailing: Aug. 24, 2010, 4 pages.

European Office Action, Summons to attend oral proceedings pursuant to Rule 115(1) EPC, European Application No. 08800974.1-2212 / 2093929, Applicant: Huawei Technologies Co., Ltd., Dated: Mar. 22, 2011, 3 pages.

* cited by examiner

REAR BOARD OF BLADE SERVER, BLADE SERVER AND SUBRACK

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

CROSS REFERENCE TO RELATED APPLICATION

This application is a continuation application of PCT/CN2008/072501, filed on Sep. 24, 2008, which claims priority to Chinese Patent Application No. 200720195101.4, filed with the Chinese Patent Office on Nov. 5, 2007 and entitled "Rear Board of Blade Server, Blade Server and Subrack", both of which are incorporated herein by reference in their entireties.

TECHNICAL FIELD

The disclosure relates to the field of blade server, and in particular, to rear board of blade server, blade server and subrack.

BACKGROUND

In the field of blade servers, the standard of Advanced Telecommunications Computing Architecture (ATCA) is a structure standard of the blade server based on a high performance of backplane. The standard of the ATCA defines standards of power in the blade server equipment and slots supplied power by the power, standards of a specification of subrack and connection between the subracks, a standard of interface and electrical connection connector, standards of exchange network and interface of the backplane, and so on. Each connector of hardware structure in the blade server is compact, consuming less energy, and occupying less space. The blade server has a better expandability, universality and interchangeability, and a better prospect in the telecom field. Suppliers such as SUN, Intel, and Motorola all provide blade servers having an ATCA structure.

With the development of the hardware, performance of the CPU becomes better and better, power consumption of the CPU is increasing accordingly. The power consumption of the CPU in the blade server is up to 95 W, and probably even to 120 W in the future, so that it becomes a challenge to design a board which can effectively dissipate heat. The ATCA structure of the conventional blade server has a compact structure. The width of the slot of each board is 1.2 inches. Superpower CPU, high capacity random-access memory (RAM), hard disk and interfaces are deployed on the board in a limited space, and it is required to meet the heat dissipation and layout of the hardware. The conventional blade server defined in the standard of ATCA may not satisfy the superpower CPU in structure, and the space of physical structure in the blade server equipment is a bottleneck for the blade server. Therefore, the ability to effectively dissipate heat in the blade server needs further study.

FIG. 1 shows a structure of blade server in the prior art. The blade server includes front board 15 and rear board 16. Front board 15 and rear board 16 are the standard dimensions defined in the standard of the ATCA. An installation defined in the standard of the ATCA is adopted: this installation includes two hard disks 11, RAM 12, CPU heat sink 13 attached to CPU (the CPU is covered by the CPU heat sink in FIG. 1), pinch board 14 and other chips are arranged on front board 15. As can be seen in FIG. 1, the two hard disks 11 occupy most of space on front board 15; therefore, the space of heat dissipation left for the CPU heat sink 13 is little, which limits the ability of CPU heat sink 13 to effectively dissipate heat. Thus, the power consumption of the CPU must be limited. Commonly, the power consumption of front board 15 is limited to be below 200 W. Thus, with the enhancement of the CPU performance, the structure of the blade server as shown in FIG. 1 is a bottleneck for the blade server designing, i.e., the structure of the blade server as shown in FIG. 1 is not suitable for the device that needs superpower CPU.

As can be seen from the above description that, the heat dissipation of the front board of the blade server is poor, and the structure of the blade server does not support the use of superpower CPU, and therefore, both the performance and reliability of the blade server are poor.

BRIEF SUMMARY

Embodiments of the present disclosure provide a rear board of a blade server, a blade server and a subrack, so as to improve heat dissipation, support the use of a superpower CPU, and improve the performance and reliability of the blade server.

A rear board of a blade server is provided in an embodiment of the present disclosure. The rear board includes a connector configured to connect hard disks, and a portion of the rear board on which the connector is set is extended outward so as to accommodate at least two hard disks, and the two hard disks are connected to the connector.

A blade server is also provided in an embodiment of the present disclosure. The blade server includes a front board and a rear board, wherein the rear board includes a standard Advanced Telecommunications Computing Architecture (ATCA) interface, and the rear board is connected to the front board through the standard ATCA interface, a connector configured to connect hard disks is set on the rear board, and a portion of the rear board on which the connector is set is extended outward so as to accommodate at least two hard disks, and the two hard disks are connected to the connector.

A subrack is also provided in an embodiment of the present disclosure. The subrack includes a power supply, a fan and a blade server, wherein the power supply is configured to provide power for the blade server, the fan is configured to dissipate heat from the blade server, the blade server includes a front board and a rear board, and wherein the rear board is connected to the front board through a standard Advanced Telecommunications Computing Architecture (ATCA) interface, a connector configured to connect to hard disks is set on the rear board, and a portion of the rear board on which the connector is set is extended outward so as to accommodate at least two hard disks, and the two hard disks are connected to the connector.

Embodiments of the present disclosure may provide at least the following exemplary benefits:

(i) Because the portion of the rear board defined in the standard of the ATCA is extended, the two hard disks are set on the rear board to achieve data backup between the two hard disks and hot plug, and the reliability of the data backup and maintainability of the blade server may be improved.

(ii) In addition, two hard disks set on the front board can be removed and set on the rear board of the blade server according to the embodiments of the present disclosure, so that a large amount of dissipating space is reserved on the front board. This greatly increases the dissipating ability of the front board. A superpower of CPU may be used in the blade server, so as to increase the performance of the blade server. For example, power consumption of the CPU used in the blade server according to the embodiments of the present disclosure may be 95 W, and the ability of dissipating of each slot in the blade server may be 300 W.

(iii) Moreover, because the rear board in the embodiments of the present disclosure is adapted to the standard interface of ATCA, the rear board of the blade server could be compatible with diverse subracks, so that this may improve the compatibility of the blade server, and this enables products of various manufactures to be interoperable.

BRIEF DESCRIPTION OF THE DRAWINGS

The accompanying drawings, which are incorporated in and constitute a part of this specification, illustrate some embodiments and together with the description, serve to explain the principles of the embodiments disclosed herein.

DETAILED DESCRIPTION

In order to use a superpower CPU to improve the performance of a blade server product, the structure of the ATCA may be extended. In order to support two or more hard disks to be used and arranged on the blade server, a rear board of the blade server is provided according to the disclosed embodiments, a portion of the rear board is extended outward to accommodate at least two hard disks, and a connector of the two hard disks is set on the rear board, so that the hard disks are set on the extended portion of the rear board through the connector of the two hard disks. Therefore, there is no need to set the hard disks on the front board when using the rear board of the blade server according to some embodiments. Furthermore, in order to conform to the ATCA standard, ATCA standard interfaces are still applicable to be used as the interfaces of a rear board after a portion of the rear board is extended.

Figure 1:
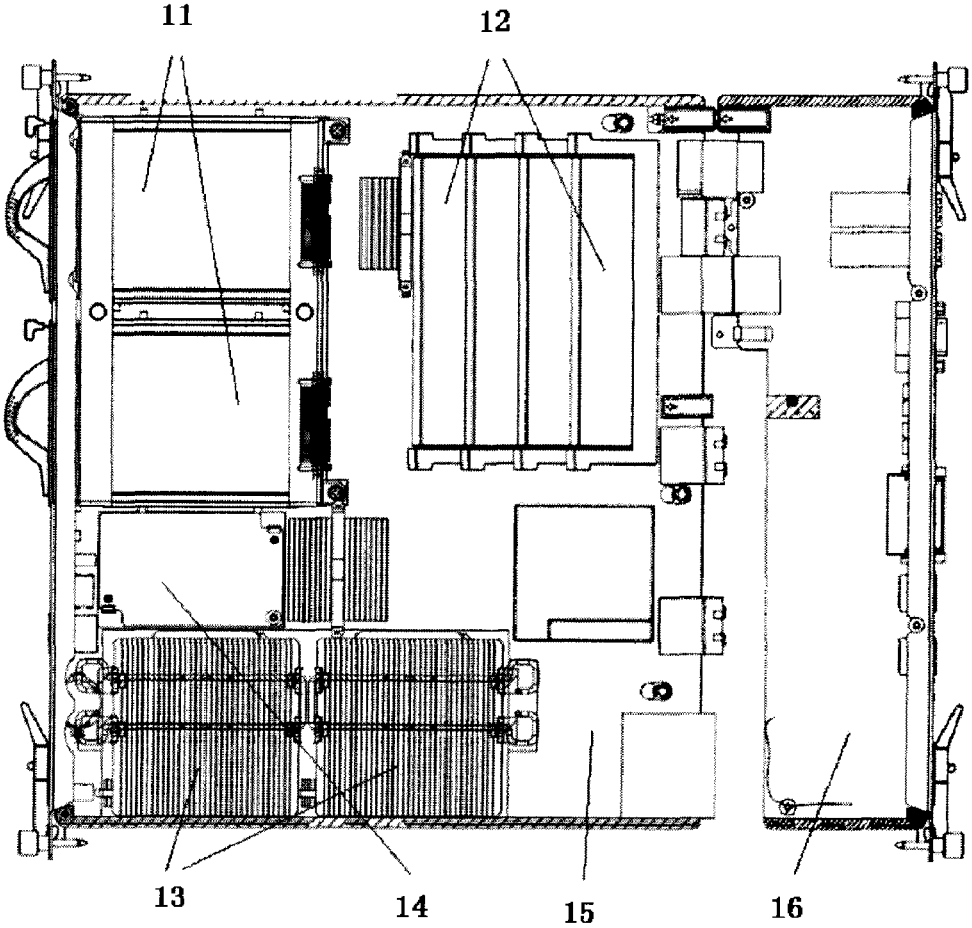
Figure 1 (Prior Art)
FIG. 1 is a schematic view of a blade server in the prior art.
Figure 2:
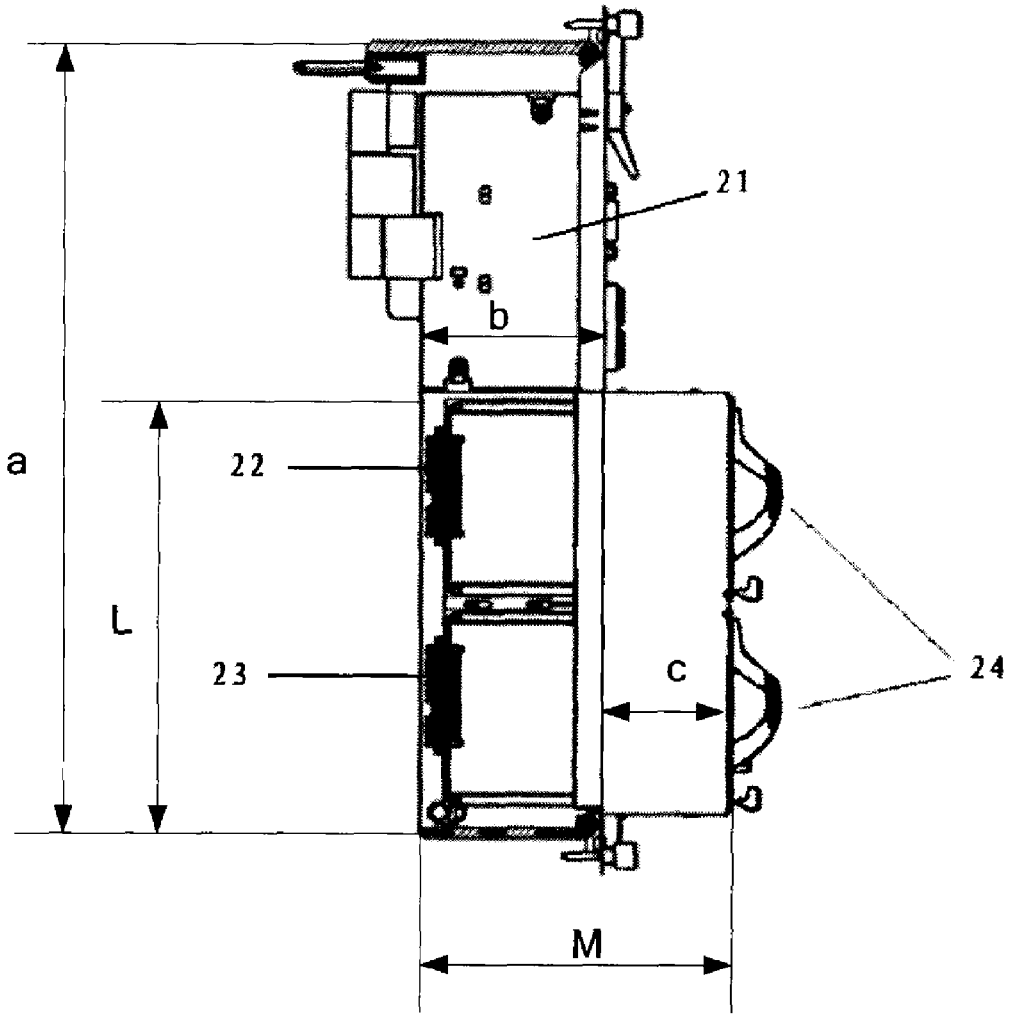
FIG. 2 is a schematic view of a rear board of the blade server according to an embodiment of the present invention.

FIG. 2 shows a structure of the rear board of the ATCA according to some embodiments. The length of the rear board 21 is the standard dimension of the ATCA, e.g., the dimension of the length of the rear board 21 as shown in FIG. 2 is 322.25 mm, i.e., a=322.25 mm, the dimension of the width of the upper portion of the rear board 21 is the standard dimension of the ATCA, e.g., the width b of the upper portion is 70.0 mm, i.e., b=70.0 mm. The lower portion of the rear board 21 is extended outward, and two parallel connectors, i.e., connector 22 and connector 23, are set longitudinally on the lower portion of the rear board 21 being extended, so as to accommodate at least two hard disks. In order to enable the two hard disks to be completely set on the lower portion of the rear board 21, it is desirable to design the dimension of the extended portion according to the selected dimension of the two hard disks. For example, when two conventional hard disks with a dimension of 2.5 inches are set on the rear board, the L*M dimension of the portion configured to accommodate two hard disks of the rear board 21 as shown in FIG. 2 is 160 mm*130 mm, i.e., L*M=160 mm*130 mm, compared with the dimension of the rear board defined in the ATCA standard, the width dimension of the rear board defined in the ATCA is 70 mm, and the width c of the extended portion of the lower portion of the rear board 21 is 60 mm, i.e., c=60 mm.

The rear board 21 as shown in FIG. 2 is only a schematic view. As shown in FIG. 2, a portion of the rear board is extended for accommodating two hard disks, and the connector connected with the two hard disks is set at the proper place on the rear board. Thus, the actual dimension of the rear board 21 and the position for accommodating the two hard disks may be changed, besides retaining the standard interface defined in the ATCA standard on the rear board 21 as shown in FIG. 2. The rear board accommodating two hard disks provided according to some embodiments may include these rear boards which have the same principle of setting, or different shapes and different methods of setting.

Preferably, slots of the hard disks are set on the extended portion of the rear board 21 (not shown in FIG. 2). The slots are configured to enable the hard disks to be inserted on the rear board along the slots and to be connected with the connector 22 and connector 23.

Preferably, as shown in FIG. 2, a handle bar 24 is set on each of the two hard disks accommodated on the rear board 21, so that it is convenient to remove the hard disk with the help of the handle bar 24. In addition, when the hard disks are pushed on the rear board, the handle bar 24 set on the hard disk may have a function of shielding, isolating the electromagnetic interference affected by the outer electromagnetism, and so on.

Preferably, in consideration of the dimension of the hard disks and the extended portion, a plurality of connectors may be set at proper position on the rear board. Each connector is connected to a hard disk, so as to ensure that multiple hard disks to be connected may be accommodated on the rear board, achieve data backup between the two hard disks, and improve the reliability of the data backup.

Preferably, the hard disks set on the rear board are hot pluggable.

Figure 3:
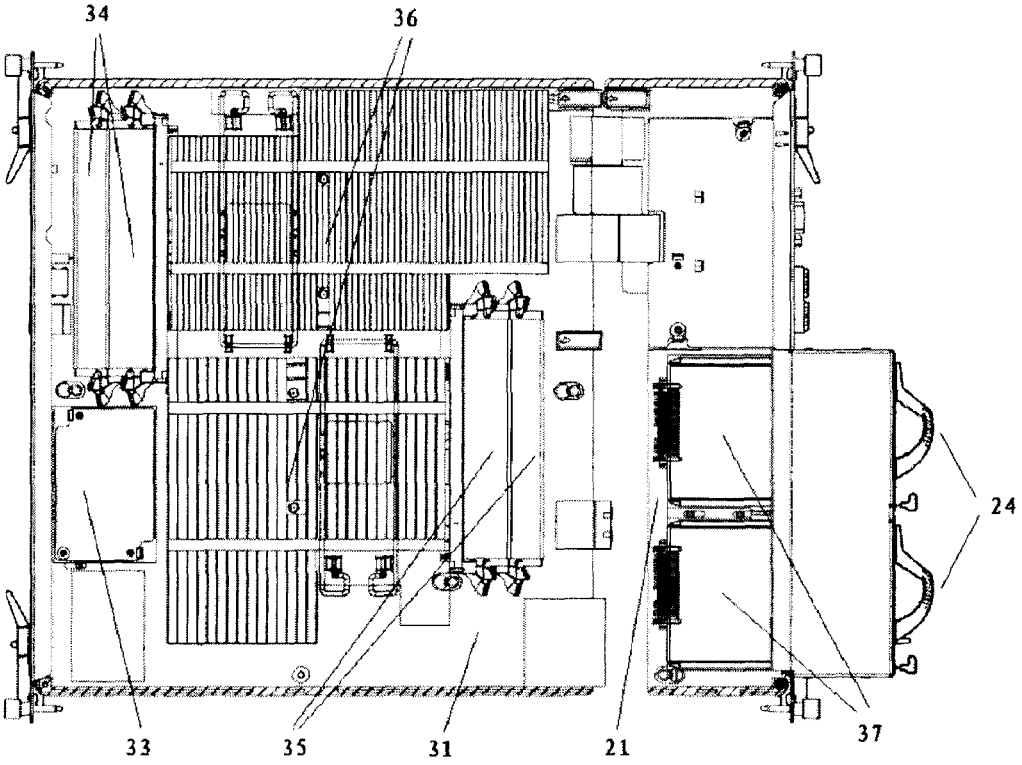
FIG. 3 is a schematic view of the blade server according to an embodiment of the present invention.

Furthermore, corresponding to the embodiment of the rear board of the blade server in accordance with some embodiments, a blade server is provided. As shown in FIG. 3, the blade server includes a front board 31 and a rear board 21, the front board 31 is connected to the rear board 21 through standard ATCA interfaces.

The front board 31 mostly includes the following apparatuses: pinch plate 33, RAM 34, RAM 35, CPU heat sink 36 and CPU (CPU is covered by the CPU heat sink 36 as shown in FIG. 3), and the apparatuses are set on the front board according to the ATCA standard. The difference between these apparatuses according to some embodiments as disclosed herein and those in the prior art lies in that: there is no need to arrange hard disks on the front board according to some embodiments disclosed herein. Accordingly, the specific structure of the front board is not described herein.

Returning to FIG. 3, the rear board 21 is connected to the front board 31 through the standard ATCA interface, and the standard ATCA interface is set on the upper-left of the rear board 21. Space of structure defined by the lower portion of the rear board 21 is used for accommodating at least two hard disks. As shown in FIG. 3, the rear board 21 is a rear board which conforms to ATCA standards, but is capable of accommodating two hard disks, wherein, two connectors of hard disks set on the rear board is lined longitudinally, and two parallel hard disks 37 are set. Each of the two hard disks 37 may have a handle bar 24 facilitating easy removal, and preferably, the two hard disks 37 are hot pluggable.

Preferably, slots of the hard disks are set on the extended portion of the rear board 21. The slots are configured to enable the hard disks to be inserted on the rear board along the slots and to be connected with the connectors.

The structure of the blade server as shown in FIG. 3 is only a schematic diagram. Each apparatus set on the front board 31 may adopt any layout of the front board defined in the ATCA standard. Installed position of hard disks defined on the ATCA front board may be set according to the placement of the CPU heat sink, i.e., installed position of hard disks defined in the standard of the ATCA is set according to the position of the CPU heat sink, so as to increase the ability of heat dissipation. The rear board 21 may be any one of rear boards consistent with the disclosed embodiments.

Because the portion of the ATCA rear board defined in the standard is extended, at least two hard disks may be set on the rear board, so that the blade server may support data backup and hot plug. Thus, this may improve the reliability of the data backup and maintainability of the blade server.

Furthermore, two hard disks set on the front board can be removed and set on the rear board of the blade server according to some embodiments of the present disclosure, so that a large amount of dissipating space is reserved on the front board. This greatly increases the ability of the heat dissipation of the front board. A superpower CPU may be used in the blade server, so as to increase the performance of the blade server. For example, power consumption of the CPU used in the blade server according to the embodiments of the present disclosure may be 95 W, and the ability of the heat dissipation of each slot in the blade server may be 300 W.

Because the rear board in some embodiments of the present disclosure adopts the standard interface of ATCA, the rear board of the blade server could be compatible with diverse subracks.

Figure 4:
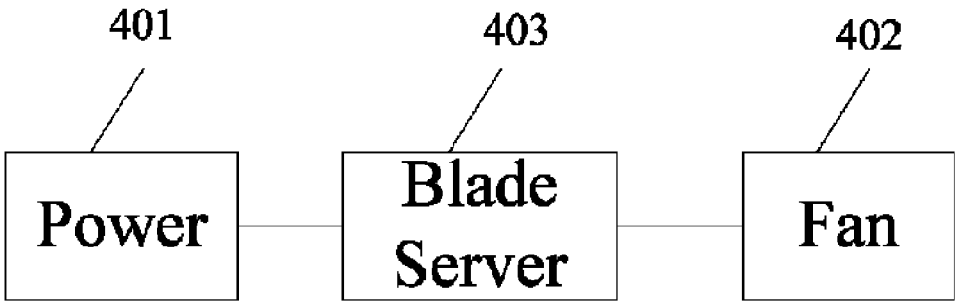
FIG. 4 is a schematic view of the subrack according to an embodiment of the present invention.

A subrack is also provided corresponding to a blade server provided according to some embodiments. As shown in FIG. 4, the subrack includes: a power supply 401, a fan 402, and a blade server 403.

The power supply 401 is configured to provide power for the blade server 403, and the fan 402 is configured to dissipate heat for the blade server 403. The blade server 403 includes a front board and a rear board, wherein, each rear board includes a standard ATCA interface, and the front board is connected to the rear board through the standard ATCA interface. Hard disk connectors are set on each rear board, and a portion of the rear board on which the hard disk connectors are set is extended outward so as to accommodate at least two hard disks.

Preferably, slots of the hard disks are set on the extended portion of the rear board. The slots are configured to enable the hard disks to be inserted on the rear board along the slots and to be connected with the connectors. A handle bar is set on each of the two hard disks, and the hard disks are pushed on the rear board, the handle bar set on the hard disk may have a function of shielding.

Although the disclosure has been described through several preferred embodiments, the disclosure is not limited to such embodiments. It is apparent that those skilled in the art can make modifications and variations to the embodiments disclosed herein without departing from the spirit and scope of the disclosure. The disclosure is intended to cover the modifications and variations provided that they fall in the scope of protection defined by the claims or their equivalents.

What is claimed is:

1. A rear board for a blade server that comprises a front board and the rear board coupled to the front board, the rear board comprising:

a non-rectangular *step-shaped* circuit board having an upper portion, a lower portion positioned laterally adjacent to the upper portion, a back end, the back end facing the front board, and a stepped front end, the stepped front end extending away from the back end and having an upper front end and a lower front end, wherein the lower portion has a first width from the back end to the lower front end and the upper portion has a second width from the back end to the upper front end, the first width being larger than the second width; and a connector configured to connect at least two hard disks arranged side by side to each other, the connector being set on the lower portion of the rear board;

wherein the lower front end of the rear board extends beyond the upper front end by a distance equal to the difference between the first width and the second width along a width from the back end of the rear board so as to accommodate the at least two hard disks when the at least two hard disks are connected to the connector and are located directly on the lower portion and extend beyond a line located a distance of the second width from the back end.

2. The rear board of claim 1, further comprising the at least two hard disks, wherein the at least the hard disks are located on the lower portion and extend beyond a line located a distance of the second width from the back end.

3. The rear board of claim 2, wherein a handle bar is set on each of the at least two hard disks and the handle bar is configured to push and pull the two hard disks.

4. The rear board of claim 2 wherein the connector comprises at least two connectors and each hard disk is connected to a respective one of the at least two connectors.

5. The rear board of claim 4, wherein the at least two connectors are aligned longitudinally.

6. The rear board of claim 1, wherein a dimension of the at least two hard disks is 160 mm*130 mm, the second width of the rear board is 70 mm, and the first width of the rear board is 130 mm.

7. A blade server, comprising:

a front board;

a rear board, wherein, the rear board comprises an interface, and a back end of the rear board is connected to the front board by the interface, the rear board comprising a non-rectangular *step-shaped* circuit board having an upper portion a lower portion positioned laterally adjacent to the upper portion, the back end facing the front board, and a stepped front end, the stepped front end extending away from the back end and having an upper front end and a lower front end, wherein the lower portion has a first width from the back end to the lower front end and the upper portion has a second width from the back end to the upper front end, the first width being larger than the second width; and at least two hard disks arranged side by side to each other, each of the at least two hard disks located directly on the lower portion and extend beyond a line located a distance of the second width from the back end; and a connector configured to connect said at least two hard disks and being set on the lower portion of the rear board wherein the lower front end of the rear board extends beyond the upper front end by a distance equal to the difference between the first width and the second width along a width from the back end of the rear board so as to accommodate the at least two hard disks.

8. The blade server of claim 7, further comprising a hard disks slot set on the rear board wherein the two hard disks are connected to the connector along the hard disks slot.

9. The blade server of claim 7, wherein a handle bar is set on the at least two hard disks, and the handle bar is configured to push and pull the at least two hard disks.

10. The blade server of claim 7, wherein the connector comprises at least two connectors, and each hard disk is connected to a respective one of the at least two connectors.

11. The blade server of claim 10, wherein the at least two connectors are aligned longitudinally.

12. The blade server of claim 7, wherein the two hard disks are hot pluggable.

13. The blade server of claim 7, wherein a dimension of the at least two hard disks is 160 mm*130 mm, the second width of the rear board is 70 mm, and the first width of the rear board is 130 mm.

14. A subrack, comprising:

a blade server;

a power supply configured to provide power for the blade server; and a fan configured to dissipate heat from the blade server;

wherein the blade server comprises:

a front board;

a rear board that is connected to the front board through a standard Advanced Telecommunications Computing Architecture (ATCA) interface, the rear board comprising a non-rectangular *step-shaped* circuit board having an upper portion, a lower portion positioned laterally adjacent to the upper portion, a back end, the back end facing the front board, and a stepped front end, the stepped front end [having] extending away from the back end and having an upper front end and a lower front end, wherein the lower portion has a first width from the back end to the lower front end and the upper portion has a second width from the back end to the upper front end, the first width being larger than the second width;

at least two hard disks arranged side by side to each other, each of the at least two hard disks located directly on the lower portion and extend beyond a line located a distance of the second width from the back end; and a connector connected to [said] *the* at least two hard disks and being set on the lower portion of the rear board, [wherein the at least two hard disks are located on an extended portion of the lower portion of the rear board,] the lower front end being extended [relative to] *beyond* the upper front end by a distance equal to the difference [of] *between* the first width and the second width so as to accommodate the at least two hard disks.

15. The subrack of claim 14, further comprising a hard disk slot set on the rear board, wherein the at least two hard disks are connected to the connector along the hard disks slot.

16. The subrack of claim 14, wherein a handle bar is set on each of the at least two hard disks and the handle bar is configured to push and pull the at least two hard disks.

17. The subrack of claim 14, wherein a dimension of the at least two hard disks is 160 mm*130 mm, the second width of the rear board is 70 mm, and the first width of the rear board is 130 mm.

18. The rear board of claim 1, further comprising a hard disks slot set on the rear board so that the at least two hard disks can be connected to the connector along the hard disks slot.

19. The rear board of claim 1, wherein the rear board is configured to be mounted on a rack at a front end of the upper portion of the circuit board, the front end of the lower portion spaced from the back end by the second width.

20. The rear board of claim 1, further comprising a bracket for mounting the rear board to a rack, the bracket spaced from the back end of the circuit board by the second width.

21. The blade server of claim 7, wherein the interface comprises an Advanced Telecommunications Computing Architecture (ATCA) standard interface.

* * * * *